(12) United States Patent
Sutardja

(10) Patent No.: US 7,148,763 B2
(45) Date of Patent: *Dec. 12, 2006

(54) INTEGRATED CIRCUIT INCLUDING PROCESSOR AND CRYSTAL OSCILLATOR EMULATOR

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 10/892,709

(22) Filed: Jul. 16, 2004

(65) Prior Publication Data

US 2004/0246809 A1    Dec. 9, 2004

Related U.S. Application Data

(63) Continuation-in-part of application No. 10/272,247, filed on Oct. 15, 2002.

(51) Int. Cl.
*H03L 1/00* (2006.01)

(52) U.S. Cl. .................. 331/176; 331/74; 331/158; 331/116 R; 331/116 FE; 331/2; 331/57; 331/185

(58) Field of Classification Search ................. 331/176, 331/66, 158, 108 C, 57, 74, 116 R, 2, 185
See application file for complete search history.

(56) References Cited

U.S. PATENT DOCUMENTS

| | | | |
|---|---|---|---|
| 4,646,035 A | 2/1987 | Chapelle et al. | 331/177 R |
| 4,893,097 A | 1/1990 | Zwack | 331/176 |
| 5,081,431 A | 1/1992 | Kubo et al. | 331/158 |
| 5,574,408 A | 11/1996 | Zwack | 331/126 |
| 5,659,270 A | 8/1997 | Millen et al. | 331/69 |
| 5,809,336 A | 9/1998 | Moore et al. | 710/25 |
| 6,598,148 B1 | 7/2003 | Moore et al. | 712/32 |
| 6,803,829 B1 | 10/2004 | Duncan et al. | 331/34 |
| 6,850,125 B1* | 2/2005 | Norman et al. | 331/65 |
| 2004/0071029 A1* | 4/2004 | Sutardja | 365/211 |

FOREIGN PATENT DOCUMENTS

| | | |
|---|---|---|
| DE | 42 09 843 A1 | 11/1993 |
| EP | 0766376 A1 | 4/1997 |
| EP | 1411630 A1 | 4/2004 |

OTHER PUBLICATIONS

Communication Pursuant to Article 96(2) EPC, for European Patent Application No. 03017477.5, 5 pages.
Communication dated Aug. 18, 2005 for Application No. 04020779.7-2206; 3 pages.

* cited by examiner

*Primary Examiner*—Arnold Kinkead

(57) ABSTRACT

An integrated circuit comprises a first circuit that receives a clock signal. A first temperature sensor senses a first temperature. Non-volatile memory that communicates with the first temperature sensor outputs calibration data as a function of the first temperature. A semiconductor oscillator that communicates with the non-volatile memory and the first circuit generates the clock signal having a frequency that is related to the calibration data. A select input selects the frequency of the output signal as a function of an external passive component.

50 Claims, 11 Drawing Sheets

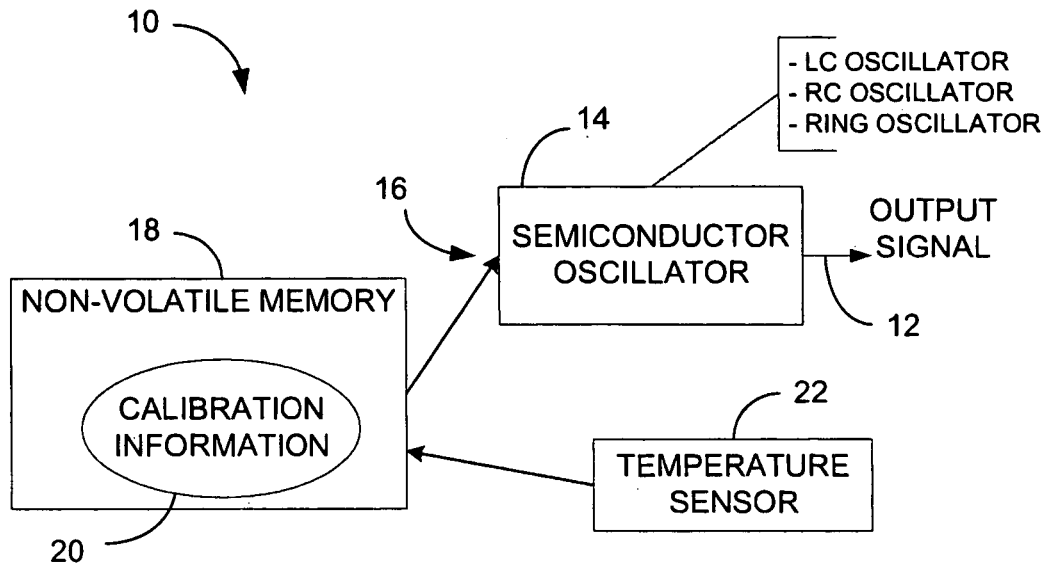
FIG. 1
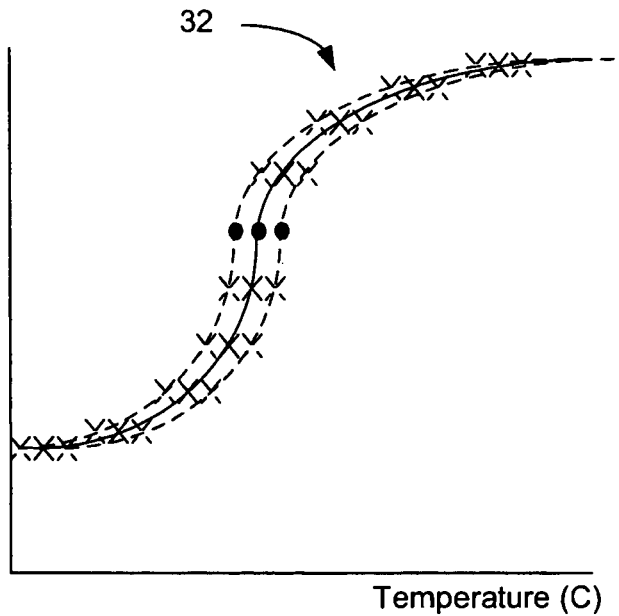
FIG. 2
FIG. 3

INTEGRATED CIRCUIT INCLUDING PROCESSOR AND CRYSTAL OSCILLATOR EMULATOR

CROSS-REFERENCE TO RELATED APPLICATIONS

This application is a continuation-in-part of U.S. patent application Ser. No. 10/272,247, filed on Oct. 15, 2002, the contents of which are hereby incorporated by reference in its entirety.

TECHNICAL FIELD

This invention relates to integrated circuits including crystal oscillator emulators.

BACKGROUND

Precision frequency references are required in many types of electronic devices such as cellular phones and other handheld devices. Crystal oscillators are typically used to provide the precision frequency reference in these electronic devices. However, crystal oscillators have several inherent disadvantages including large bulky size, fragility, and high cost. In addition, the size and cost of crystal oscillators is related to the resonant frequency so that as the frequency increases, the size decreases, and the cost and fragility may rapidly increase. As the size of electronic devices continues to decrease, the use of crystal oscillators becomes more problematic due to the size, fragility, and cost limitations.

Semiconductor oscillators have been a poor alternative to crystal oscillators and are generally unsuitable for use as a precision frequency reference due to excessive variation in the oscillating frequency, especially with changes in temperature.

SUMMARY

An integrated circuit comprises a first circuit that receives a clock signal. A first temperature sensor senses a first temperature. Non-volatile memory that communicates with the first temperature sensor outputs calibration data as a function of the first temperature. A semiconductor oscillator that communicates with the non-volatile memory and the first circuit generates the clock signal having a frequency that is related to the calibration data.

In other features, the first circuit includes a processor that processes data. The first temperature represents a change in temperature from an initial temperature to a second temperature. The integrated circuit has a die temperature. The first temperature is approximately equal to the die temperature. A select input selects the frequency of the output signal as a function of an external passive component.

In still other features, a second temperature sensor senses an external temperature. A heater controls a die temperature. A controller controls the heater in response to the first and second temperature sensors.

In other features, an active silicon oscillator generates an output signal having a frequency. A summer determines a frequency error between the output signal of the semiconductor oscillator and the output signal of the active silicon oscillator. A controller controls the output signal of the active silicon oscillator as a function of the frequency error. The active silicon oscillator includes a ring oscillator having a supply voltage. A regulator that communicates with the controller controls the supply voltage to reduce the frequency error. The controller further controls the output signal of the active semiconductor oscillator as a function of the first temperature. The regulator controls an electrical characteristic of the supply voltage selected from the group consisting of voltage and current. A second processor receives the clock signal.

In other features, a clock divider generates at least one other clock signal having a lower frequency than the first frequency. At least one other circuit receives the at least one other clock signal. The at least one other circuit includes a second processor.

An integrated circuit comprises a first circuit that receives a clock signal. A first temperature sensor senses a die temperature of the integrated circuit and generates a temperature signal. A heater maintains the die temperature at a predetermined operating temperature in response to the temperature signal. Non-volatile memory stores calibration data relating the predetermined operating temperature to the clock signal. A semiconductor oscillator generates the clock signal based on the calibration information.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a block diagram showing an aspect of a crystal oscillator emulator.

FIG. 2 is a table showing a relationship between temperature and correction factor.

FIG. 3 is a graph showing a relationship between temperature and correction factor.

Like reference symbols in the various drawings indicate like elements.

DETAILED DESCRIPTION

Figure 4:
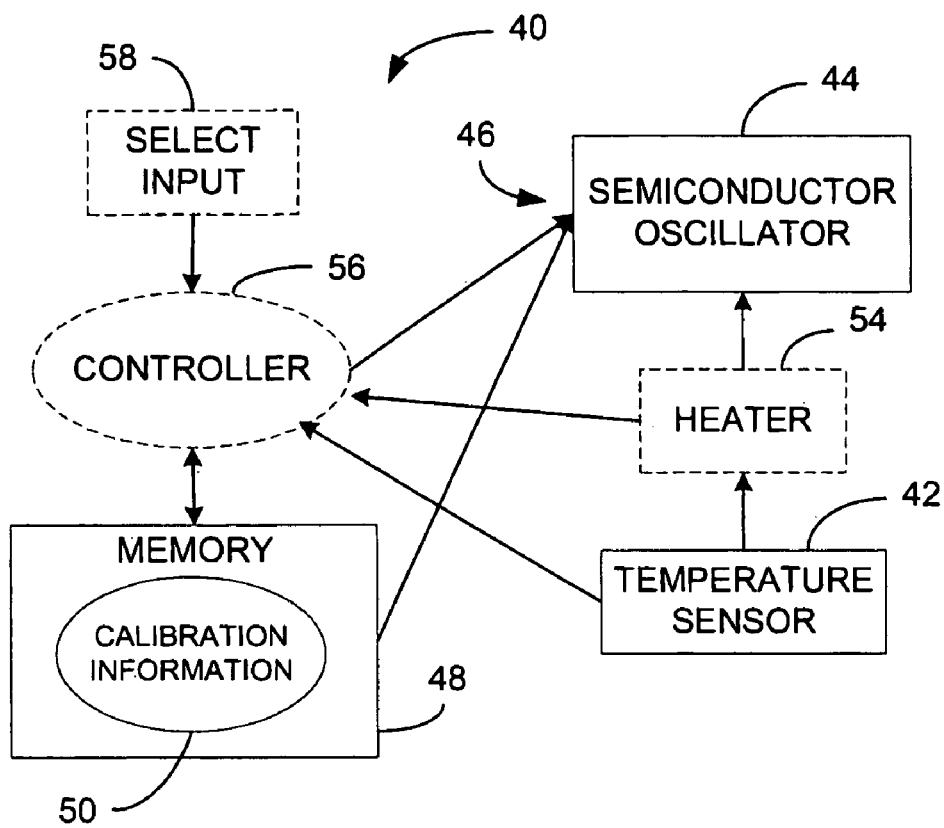
FIG. 4 is a block diagram showing an aspect of a crystal oscillator emulator.

FIG. 1 shows an aspect of a crystal oscillator emulator 10 for generating an output signal 12 having a precise frequency. The crystal oscillator emulator 10 may be constructed on a single semiconductor die using any process including a Complementary-Metal-Oxide-Semiconductor (CMOS) process.

The crystal oscillator emulator 10 may include a semiconductor oscillator 14 to generate the output signal 12. Any type of semiconductor oscillator may be used including LC oscillators, RC oscillators, and ring oscillators. The semiconductor oscillator 12 includes a control input 16 to vary the frequency of the output signal. The control input 16 may be any electrical input that effects a controlled change in the output signal frequency such as the supply voltage of a ring oscillator and a voltage input to a varactor of an LC oscillator.

A non-volatile memory 18 includes calibration information 20 for controlling the output signal frequency as a function of temperature. Any type of non-volatile memory may be employed including content addressable memory (CAM). The calibration information 20 may include a correction factor to be applied to the control input 16 of the semiconductor oscillator 14 to control the output signal frequency. The calibration information 20 may be a function of a change in temperature from a calibration temperature to an operating temperature, as well as being a function of absolute temperature.

A temperature sensor 22 may sense the temperature of the semiconductor die. Preferably, the temperature sensor is located on the semiconductor die in the vicinity of the semiconductor oscillator 14. Any type of temperature sensor 22 may be used including thermistors and infrared detectors. The temperature sensor 22 may be configured to measure a change in temperature from a baseline temperature or the present temperature.

FIG. 2 shows a storage technique 30 for storing the calibration information 20 in the non-volatile memory 18. The storage technique 30 may be any form of database including CAM, indexing schemes, look-up tables, and hash tables.

FIG. 3 shows a series of exemplary graphs 32 of correction factor values versus temperature for maintaining a constant output signal frequency for the crystal oscillator emulator 10. The data for constructing the curve may be attained in any manner including device-level testing and batch-mode testing.

Exemplary device-level testing may include testing each device to determine correction factors to be applied to the semiconductor oscillator to maintain a constant output frequency with changes in temperature. In one scheme, a baseline value for the semiconductor oscillator control input is determined for a predetermined frequency and at a predetermined temperature of the semiconductor die of the device such as the lowest operating temperature. The baseline value may be measured directly or interpolated from measurement of another device characteristic. Baseline values may also be measured for each potential output frequency. Also, baseline values for each potential output frequency may be extrapolated from the baseline value for the predetermined frequency such as by using a known circuit relationship. The baseline values for each potential output frequency may be stored as absolute values or as a ratio, a frequency factor, to compute the baseline values from a single baseline value.

The temperature of the semiconductor die is then increased from about the lowest operating temperature to about the maximum operating temperature in discrete steps. The number of discrete steps is preferably limited to about six temperature levels to reduce testing costs, but any number of discrete steps may be used. Preferably, an on-chip heater is used to heat the semiconductor die, but any means of varying the temperature of the semiconductor die may be employed. At each discrete step, the semiconductor die temperature and the correction factor for maintaining the output at a constant frequency may be measured.

The correction factor is preferably a ratio to be applied to the baseline value to obtain an adjusted value for the control input. The calibration factor may range from any baseline value such as 1. Preferably, a single correction factor is computed for each temperature step, to be applied to the semiconductor oscillator to maintain the output signal at any one of a multitude of predetermined frequencies. For example, if a correction factor of 1.218 is determined to correspond to a change in temperature of 45 C, then the control input of the semiconductor oscillator may be adjusted as a function of the correction factor such as by changing the control input in proportion to the correction factor. In another alternative, the correction factor may be applied to the baseline value corresponding to the desired output frequency to generate a calibrated value to which the control input is adjusted. In another alternative, correction factors may be measured corresponding to each of several output frequencies at each temperature step.

Batch-mode testing of crystal oscillator emulators 10 to obtain calibration information 20 may advantageously decrease costs by reducing the number of measurements for a batch of semiconductor dies. In batch-mode testing, the testing results for a subset of crystal oscillator emulators 10 from the same batch of semiconductor dies may be used for all of the devices in the batch. The subset of crystal oscillator emulators that are tested may range from one to any proportion of the total quantity of devices. For example, a single crystal oscillator emulator 10 may be tested and the resulting batch calibration information stored in each of the devices in the batch. In addition, each of the crystal oscillator emulators 10 may be tested for a subset of calibration information such as the output frequency at a baseline temperature. The subset of device specific calibration information may be used to modify the batch calibration information stored in each device.

FIG. 4 shows another aspect of a crystal oscillator emulator 40. The crystal oscillator emulator 40 is similar to crystal oscillator 10 in function with similar corresponding elements numbered in the range of 40–52, except that crystal oscillator emulator 40 may also include one or more of a heater 54, a controller 56, and a select input 58 alone or in combination.

The heater 54 may be located on the semiconductor die in the vicinity of the semiconductor oscillator 44 to provide a source of local heating. Any type of heater 54 may be used including transistor heaters and resistive heaters. The heater 54 may be operated in response to an input from the temperature sensor 52 to control the temperature of the semiconductor die. The heater 54 may increase the semiconductor die temperature to a level that corresponds to one of the temperature levels for which correction factors have been determined. In addition, a package having a high thermal impedance may enclose the crystal oscillator emulator 40.

In one case, the heater 54 may increase the semiconductor die temperature to the maximum operating temperature. Here, during device or batch level testing only the correction factor corresponding to the maximum operating temperature would have to be determined, leading to reduced costs.

The heater 54 may also be controlled to raise the semiconductor die temperature to one of several predetermined temperature levels for which correction factors have been determined. A second temperature sensor may sense an external temperature such as an ambient temperature or an assembly temperature. The heater 54 then may increase the semiconductor die temperature to the nearest of the predetermined temperature levels while continuously changing the control input during the temperature transition using extrapolated values computed from the correction factors.

The controller 56 may add extra functionality by for example controlling the heater 54 in response to multiple temperature sensors or manipulating the calibration information 50 to derive values for the control input that correspond to intermediate temperatures. The controller 56 may be any type of entity including a processor, logic circuitry, and a software module.

The select input 58 may be used for selecting specific output frequencies from within a range of output frequencies. The output frequency may be selected as a function of the impedance of an external component connected to the select input. The external component may be used directly as a portion of the semiconductor oscillator to select the output frequency, or indirectly such as selecting values of impedance within a predetermined range may correspond to predetermined output frequencies. The external component may be any component, but is preferably a passive component such as a resistor or capacitor.

Figure 5:
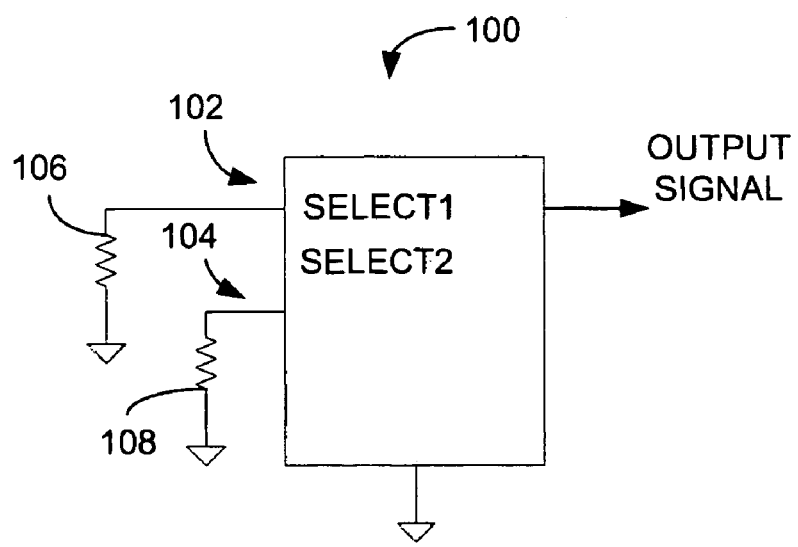
FIG. 5 is a two-dimensional view of an aspect of a crystal oscillator emulator connected to external impedances.

FIG. 5 shows an aspect of a crystal oscillator emulator 100 having, for example, two select pins 102 and 104 to connect to two external impedances 106 and 108. One or more pins may be used to interface to the external component(s). The crystal oscillator emulator 100 probes or derives information from the external components connected to the select pins 102 and 104. The derived information may have three or more predetermined level ranges that correspond to selected levels of the emulator characteristics. For example, a single pin connected to an external resistor may be used to select any one of 16 output frequency levels. The resistance of the external resistor is preferably selected to be one of 16 predetermined standard values. Each of the 16 values of resistance corresponds to one of the 16 output frequency levels. In addition, low precision passive components are preferably used as the external components to reduce cost and inventory. Each external component may have multiple, N, predetermined nominal values that each correspond to the selection of a predetermined characteristic level. If one pin is used, then N different characteristic levels may be selected. If two pins are used, then N*N different characteristic levels may be selected, and so forth for an increasing number of selection pins. The types of device characteristics that for example may be selected include output frequency, frequency tolerance, and baseline correction factor. For example, the crystal oscillator emulator 100 may have a single select pin 102 connected to an external resistor that may have a nominal value selected from a group of 16 predetermined values. Each of the 16 predetermined values has a measured value range which corresponds to one of 16 predetermined output frequency levels possibly ranging from 1 MHz to 100 MHz.

The external impedances 106 and 108 are preferably resistors, capacitors, or combinations of resistors and capacitors, but may be any component that exhibits predominantly an inductance, resistance, capacitance, or combination thereof. The external impedances 106 and 108 may be connected directly or indirectly from any energy source such as Vdd and ground or any suitable reference to the pins 102 and 104. For example, the external impedance 106 may be connected through a resistor/transistor network to Vdd and through a capacitor network to the select pin 102.

The crystal oscillator emulator 100 may determine a predetermined select value corresponding to the measured value of the impedance connected to a select pin. Preferably, the impedance is selected to have a standard value such as nominal resistance values corresponding to resistors having a 10% tolerance (e.g. 470, 560, 680, . . . ) to reduce device and inventory costs. To account for measurement tolerances and the tolerance of the external impedance, a range of impedance values may correspond to a single select value. The select value is preferably a digital value, but may also be an analog value. For example, values of measured resistance from 2400 ohms to 3000 ohms may be associated with a digital value corresponding to 2. While values of measured resistance from 3001 ohms to 4700 ohms are associated with a digital value corresponding to 3. The measured resistance includes variations due to tolerances of the external impedance and the internal measurement circuit. The impedance measured at each select pin is used to determine a corresponding digital value. The range of digital values may include 3 or more digital values and preferably range from 10 to 16 digital values per select pin. The digital values corresponding to each select pin may be used in combination to describe memory addresses. For example, a device having three select pins each to interface to impedance values that are mapped into one of 10 digital values, may describe 1000 memory addresses or lookup table values. The contents of the storage locations corresponding to the memory addresses are used to set a value for an output or internal characteristic of the device. Another exemplary device may include two select pins, each configured to interface to external impedances that are mapped to a digital value within a range of 10 values. The digital values in combination may describe 100 memory addresses or lookup table values that may each contain data for setting a characteristic of the crystal oscillator emulator 100.

Figure 6:
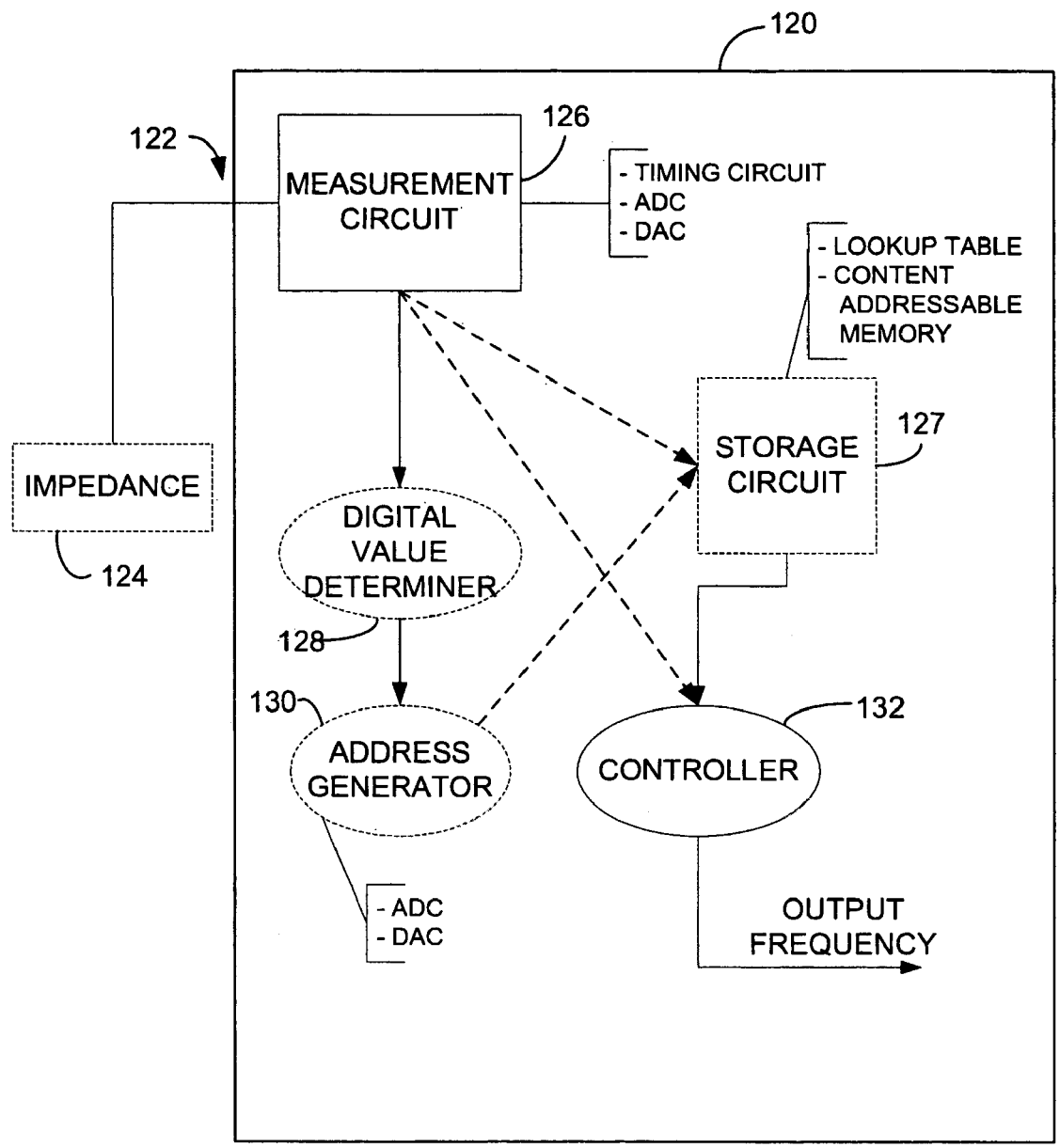
FIG. 6 is a detailed block diagram of an aspect of a crystal oscillator emulator connected to an external impedance.

FIG. 6 shows a block diagram of an aspect of a crystal oscillator emulator 120. The crystal oscillator emulator 120 includes a select pin 122 to interface to an external impedance 124 that is used for selecting a configuration of the crystal oscillator emulator 120. The external impedance 124 is similar in function and scope to the external impedances 116 and 118.

A measurement circuit 126, connected to the select pin 122 measures an electrical characteristic that is a function of the external impedance 124. For example, a current may be supplied to the external impedance and the voltage that is developed across the external impedance 124 then measured. Also, a voltage may be impressed across the external impedance 124 and then measure the current. Any measurement technique for measuring passive components may be used to measure the electrical characteristic including dynamic as well as static techniques. Exemplary measurement techniques include timing circuits, analog to digital converters (ADCs), and digital to analog converters (DACs). Preferably, the measurement circuit has a high dynamic range. The measurement circuit 126 may generate an output having a value corresponding to the value of the external impedance 124. The output may be either digital or analog. The same output value preferably represents a range of external impedance values to compensate for value variations such as tolerances in the external impedance value, interconnect losses, and measurement circuit tolerances due to factors including process, temperature, and power. For example, all measured external impedance values ranging from greater than 22 up to 32 ohms may correlate to a digital output value of "0100". While measured external impedance values ranging from greater than 32 up to 54 ohms may correlate to a digital output value of "0101". The actual external impedance values are a subset of the measured external impedance value to account for the value variations. For example, in the above cases the actual external impedance values might be from 24 to 30 ohms and from 36 to 50 ohms. In each case an inexpensive low precision resistor may be selected to have a value centered within the range, such as 27 ohms and 43 ohms. In this way, inexpensive low precision components may be used to select amongst a range of high precision outputs. The select value may be used directly as a variable value to control a device characteristic of the crystal oscillator emulator 120. The variable value may also be determined indirectly from the select value.

A storage circuit 127 may include variable values that may be selected as a function of the select value. The storage circuit 127 may be any type of storage structure including content addressable memory, static and dynamic memory, and look-up tables.

For the case that the measurement circuit 126 generates output values that have a one-to-one correspondence to the external impedance values, a digital value determiner 128 may then set the output value to a select value that corresponds to a range of external impedance values.

Figures 7A, 7B:
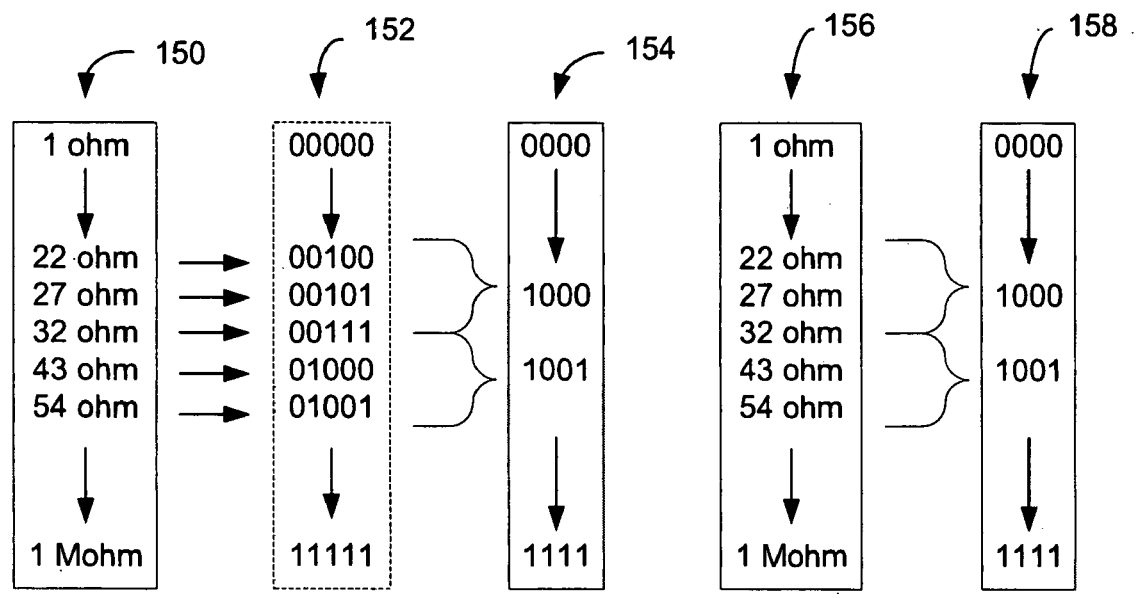
FIGS. 7A and 7B are diagrams showing relationships between an external impedance value and a digital value.

FIG. 7A shows a relationship between groups of impedance values 150 and associated select values 154. The groups of impedance values 150 may have a one-to-one correspondence to groups of digital output values 152 which are converted to the select values 154 associated with each of the groups of impedance values 150. The impedance values ranging from a minimum impedance value to a maximum impedance are separated in into three or more groups, with each group having a nominal impedance. The nominal impedance values of each of the groups may be selected to have a spacing between nominal impedance values. Here, the nominal values, 27 ohms and 43 ohms, of the groups of impedance values have a spacing of 16 ohms. The spacing between the groups of impedance values is preferably based on geometric progression, however any mathematical relationship may be used to establish spacing between the groups such as logarithmic, linear, and exponential. The spacing between impedance groups may be based on any impedance value of the groups including a nominal value, an average value, a mean value, a starting value, and an ending value. Factors that influence selection of the impedance range of the groups and the spacing may include various tolerances such as the tolerance of the external impedance, the tolerance of internal voltage and current sources, and the tolerance of the measurement circuit. The tolerances may for example be caused by process, temperature, and power variations.

FIG. 7B shows a relationship between ranges of impedance values 156 and associated select values 158. The ranges of impedance values 156 have a direct correspondence to the select values 158. The impedance values ranging from a minimum impedance value to a maximum impedance are separated in into three or more groups, with each group having a nominal impedance. The nominal impedance values of each of the groups may be selected to have a spacing between nominal impedance values. Here, the nominal values, 27 ohms and 43 ohms, of the groups of impedance values have a spacing of 16 ohms. This direct correspondence between the ranges of impedance values 156 and associated select values 158 may be implemented by, for example, a nonlinear analog to digital converter (not shown).

Referring back to FIG. 6, an address generator 130 may determine memory locations corresponding to the digital output values associated with external impedances connected to the select pins. The memory locations may be grouped in any manner such as a list for a single select pin, a lookup table for two select pins, and a third order table for three select pins.

A controller 132 may set a device characteristic of the crystal oscillator emulator 120 as a function of the variable value. The variable value may be generated directly by the measurement circuit, determined indirectly from the select value, and determined from the contents of a memory location corresponding to the external impedance values connected to the select pins.

The select pin 124 may also be used for implementing an additional function such as power down (PD), power enable, mode selection, reset, and synchronous operation. In this aspect, the select pin 124 becomes a multi-purpose select pin 124 for configuring the crystal oscillator emulator 120 as well as implementing the additional function.

In one aspect, a first range of impedance values connected to the multi-purpose select pin 124 may be used to configure the crystal oscillator emulator 120, while operation of the additional function may be controlled by a voltage or current impressed on the multi-purpose select pin 124, or impedance values outside the first range of impedance values.

Figure 8:
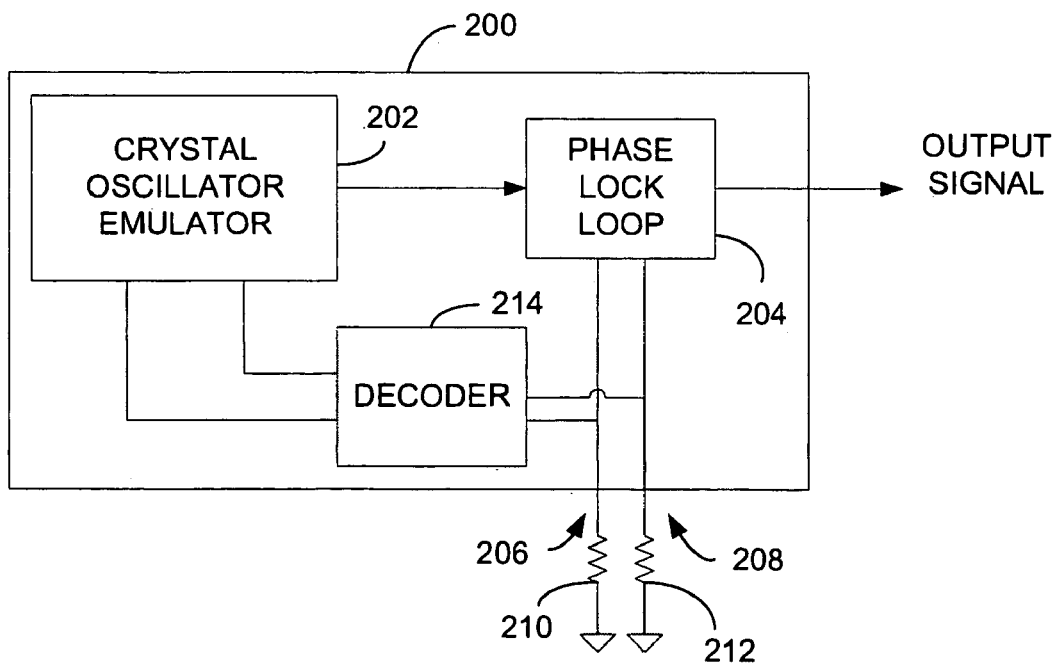
FIG. 8 is a block diagram of an aspect of an oscillator assembly for generating an output having a periodic waveform.

FIG. 8 shows an aspect of an oscillator assembly 200 to generate an output having a periodic waveform. The oscillator assembly 200 includes a crystal oscillator emulator 202 to drive a phase lock loop (PLL) 204. The crystal oscillator emulator 202 may be similar in function and structure to the aspects of the crystal oscillator emulators described above. The oscillator assembly 200 may include any type of PLL 204 such as digital PLLs and analog PLLs.

Multi-purpose select pins 206 and 208 may be used for selection of the operating parameters for the PLL 204 such as the divider factor. The multi-purpose select pins 206 and 208 may also be used for control and operation of the crystal oscillator emulator 202 such as output frequency selection and reception of a reference clock for calibration. External resistors 210 and 212 may be connected to the multi-purpose select pins 206 and 208 to select the operating frequency. The ranges of values of the external resistors 210 and 212 correspond to the selection of different operating frequencies. Each external resistor 210 and 212 may be used to select one of 16 predetermined operating frequencies. In combination, the external resistors 210 and 212 may select from amongst 256 operating frequencies. To control multiple functions, each of the multi-purpose select pins 206 and 208 may receive signals within different voltage ranges. For example, one multi-purpose select pin 206 may connect to an external resistor 210 across which a voltage in the range of 0 to 2 volts may be developed to determine the resistance, and the multi-purpose select pin 206 may also receive a reference clock signal operating in a range of 2 to 3 volts. A decoder 214 may detect signals on the multi-purpose select pins 206 and 208.

Figure 9:
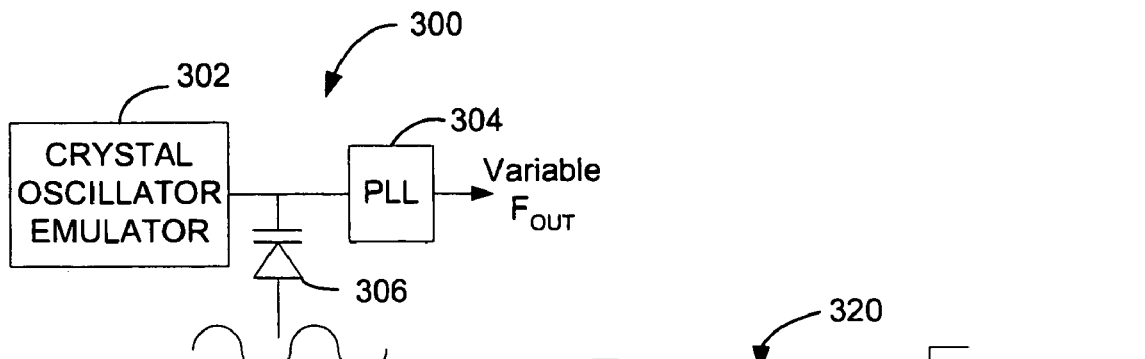
FIG. 9 is a block diagram of an aspect of a spread spectrum generator.

FIG. 9 shows a spread spectrum oscillator 300 for generating an output signal having a variable frequency. The spread spectrum oscillator 300 includes a crystal oscillator emulator 302 connected to a PLL 304. A frequency control device connected to the crystal oscillator emulator 302 may dynamically control the output frequency of the crystal oscillator emulator 302. The frequency control device may be any device or technique including a varactor, controlling the bias current source of the semiconductor oscillator, and controlling the control input voltage applied to the resonant capacitors of the semiconductor oscillator.

Figure 10:
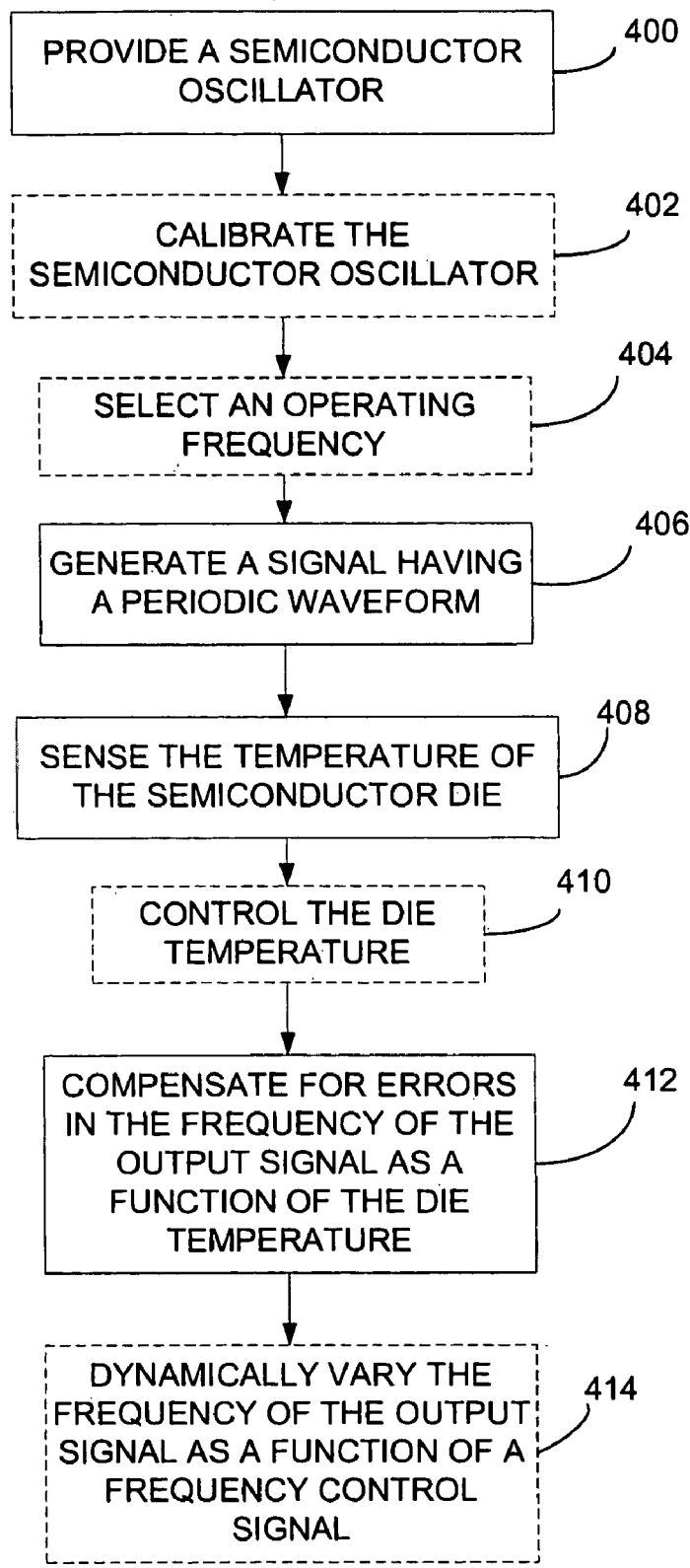
FIG. 10 is a flow diagram of an operation for emulating a crystal oscillator.

FIG. 10 shows the operation of an aspect of a crystal oscillator emulator. At block 400, a semiconductor oscillator is provided for generating an output signal having a periodic waveform. Continuing to block 402, the semiconductor oscillator may be calibrated to generate a constant frequency over a predetermined range of temperature. In one aspect, the calibration may include varying the temperature of the semiconductor die over a predetermined temperature range and measuring calibration information for maintaining a constant output frequency. The die temperature may be measured in the vicinity of the semiconductor oscillator. The calibration information may include control input values versus die temperatures for maintaining a constant output frequency. The calibration information may be stored in non-volatile memory on the semiconductor die. At block 404, an operating frequency may be determined by probing an external component. Continuing to block 406, the semiconductor oscillator generates an output signal having an operating frequency. At block 408, the temperature of the semiconductor die is determined in the vicinity of the semiconductor oscillator. Continuing to block 410, the semiconductor die may be heated or cooled to control the die temperature to one or more predetermined temperature levels. At block 412, the control input may be controlled as a function of the die temperature to compensate for changes in the operating frequency of the output signal caused by temperature changes. The stored calibration information may be used to control the control input. The calibration information may be used directly for die temperatures that correspond to stored temperatures. For other die temperatures, the control input value may be extrapolated from the stored calibration information. Continuing to block 414, the frequency of the output signal may be dynamically varied as a function of a frequency control signal.

Figure 11:
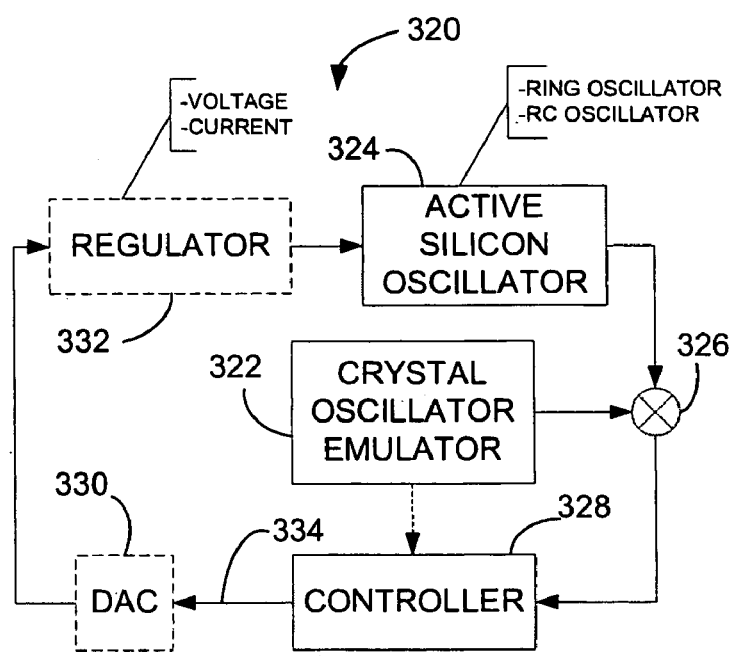
FIG. 11 is a block diagram of an aspect of a low power oscillator.

FIG. 11 shows an aspect of a low power oscillator 320 for generating a periodic signal. The low power oscillator 320 includes a crystal oscillator emulator 322 to calibrate an active silicon oscillator 324. The crystal oscillator emulator 322 is normally in the off state to reduce power consumption. At predetermined intervals, the crystal oscillator emulator 322 is switched to the powered on state to calibrate the active silicon oscillator 324. The active silicon oscillator 324 consumes less power than the crystal oscillator emulator 322, so operating the active silicon oscillator 324 continuously while only operating the crystal oscillator emulator 322 intermittently reduces the overall power consumption of the low power oscillator 320. Any type of active silicon oscillator may be used including ring oscillators and RC oscillators. The crystal oscillator emulator 324 may be configured in accordance with any of the aspects of the invention as described and shown in this specification.

A summer 326 may determine the frequency error between the active silicon oscillator output and the crystal oscillator emulator output. A controller 328 may generate a control signal, based on the frequency error, to control the frequency of the active silicon oscillator 324. The controller 328 may also receive temperature information from the crystal oscillator emulator 322. The temperature information may include temperatures such as the temperature of the semiconductor and the ambient temperature. The controller 328 may include calibration information for the active silicon oscillator 324 similar to the calibration information for the crystal oscillator emulator 322. The frequency error may be used to set an initial value for the control signal and then the temperature information in combination with the active silicon oscillator calibration information may be used to update the control signal while the crystal oscillator emulator 322 is powered down. In one aspect, the temperature sensing circuit of the crystal oscillator emulator 322 may remain continuously powered so that continuous temperature information may be supplied to the controller 328. The control signal 334 may be either digital or analog. If the control signal is digital, a digital-to-analog converter (DAC) 330 may convert the control signal to analog.

A regulator 332 may, in response to the control signal 334, control the supply of power for the active silicon oscillator 324 to adjust the operating frequency. The supply of voltage and/or current to the active silicon oscillator 324 may be controlled. For example, the regulator 332 may control the voltage level of the supply voltage.

In operation, the active silicon oscillator 324 is normally in the on state generating a periodic output signal. The crystal oscillator emulator 322 is normally in the off state. In the off state, either all or a portion of the crystal oscillator emulator 322 may be powered off to conserve power. At a predetermined time, power is applied to the crystal oscillator emulator 322. The semiconductor oscillator of the crystal oscillator emulator 322 is then calibrated with the stored calibration information. The frequency of the output signal of the crystal oscillator emulator 322 is compared with the frequency of the output signal of the active silicon oscillator 324 to determine the frequency error of the active silicon oscillator 324. The control signal 334 changes in response to the frequency error, causing a shift in the supply voltage from the voltage regulator 332, leading to a change in the output frequency of the active silicon oscillator 324, reducing the frequency error.

Figure 12:
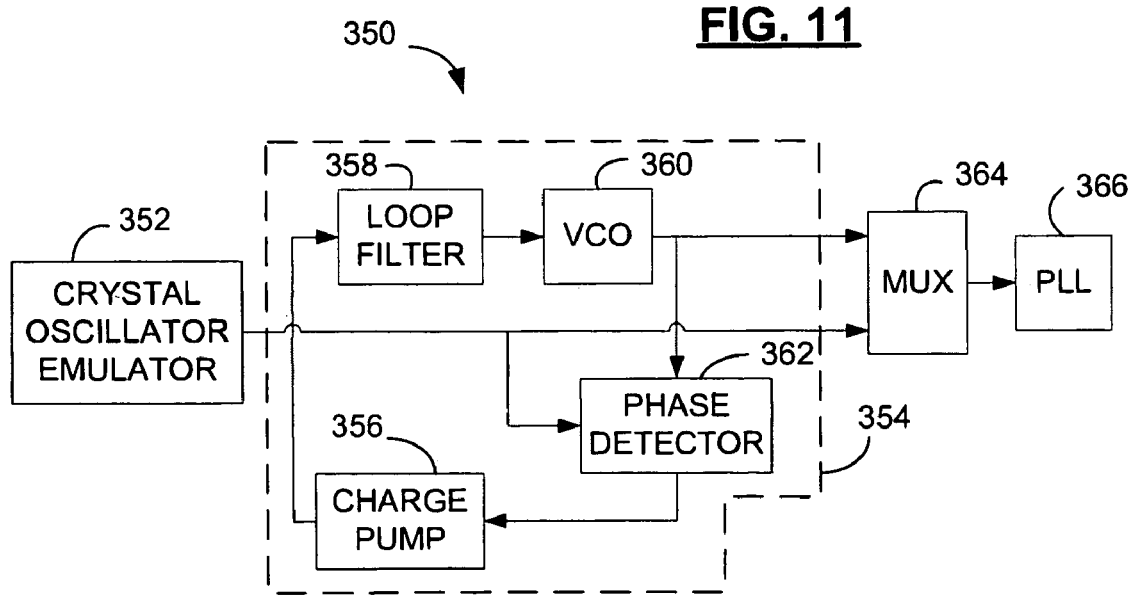
FIG. 12 is a block diagram of another aspect of a low power oscillator.

FIG. 12 shows an aspect of another low power oscillator 350 for generating a periodic signal. The low power oscillator 350 includes a crystal oscillator emulator 352 in communication with a charge pump oscillator 354. The crystal oscillator emulator 352 is normally in the powered down state to reduce power consumption. During the powered down state, either all or a portion of the crystal oscillator emulator 352 may be powered down. At predetermined intervals, the crystal oscillator emulator 352 may be powered up and used to calibrate the charge pump oscillator 354. The predetermined intervals may be determined as a function of any circuit parameter such as operating time, temperature change of the semiconductor, ambient temperature change, temperature of the semiconductor, and supply voltage change.

The charge pump oscillator 354 may include a charge pump 356, loop filter 358, voltage controlled oscillator (VCO) 360, and phase detector 362. The charge pump oscillator 354 is similar in operation to conventional charge pump oscillators, except that the reference input of the phase detector 362 receives a reference clock signal from the crystal oscillator emulator 352.

A multiplexer 364 receives the output signals from the crystal oscillator emulator 352 and the charge pump oscillator 354. One of the output signals is selected and passed through the multiplexer 375 to a phase locked loop 366. The phase locked loop 366 generates an output signal as a function of the output signals from the crystal oscillator emulator 352 and the charge pump oscillator 354.

In operation, the charge pump oscillator 354 is normally in the on state generating a periodic output signal. The crystal oscillator emulator 352 is normally in the off state. In the off state, either all or a portion of the crystal oscillator emulator 352 may be powered off to reduce power consumption. At a predetermined time, power is applied to the crystal oscillator emulator 352. The semiconductor oscillator of the crystal oscillator emulator 352 is then calibrated with the stored calibration information. The output signal of the crystal oscillator emulator 352 is compared with the output signal of the charge pump oscillator 354 to determine the phase error of the charge pump oscillator 324. The VCO 360 is then controlled to reduce the phase error so that the output signal of the charge pump oscillator 354 is calibrated to the output signal of the crystal oscillator emulator 352. One of the output signals may then be selected and applied to the PLL 366.

Figure 13:
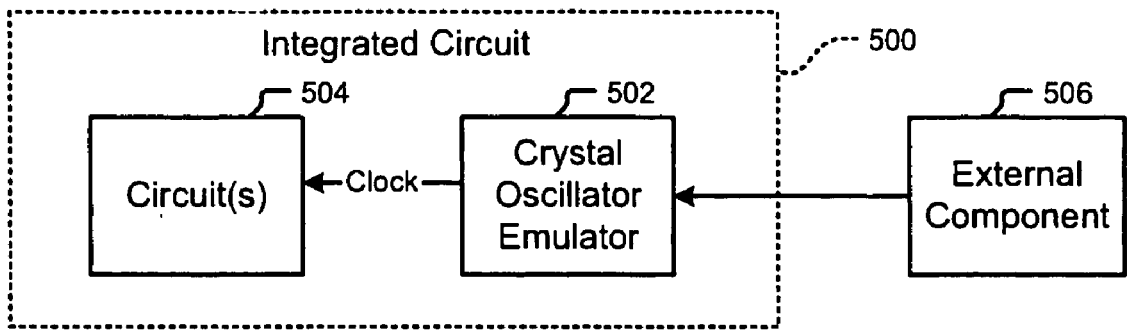
FIG. 13 is a functional block diagram of an integrated circuit including one or more circuits and a crystal oscillator emulator that generates a clock signal for the one or more circuits.
Figure 14:
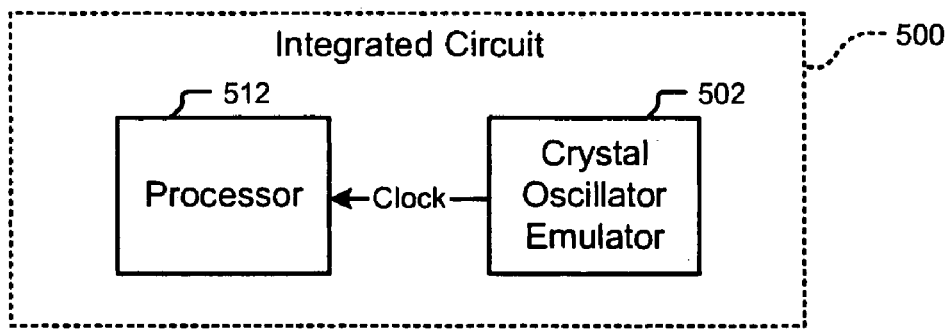
FIG. 14 is a functional block diagram of an integrated circuit including a processor and a crystal oscillator emulator that generates a clock signal for the processor.
Figure 15:
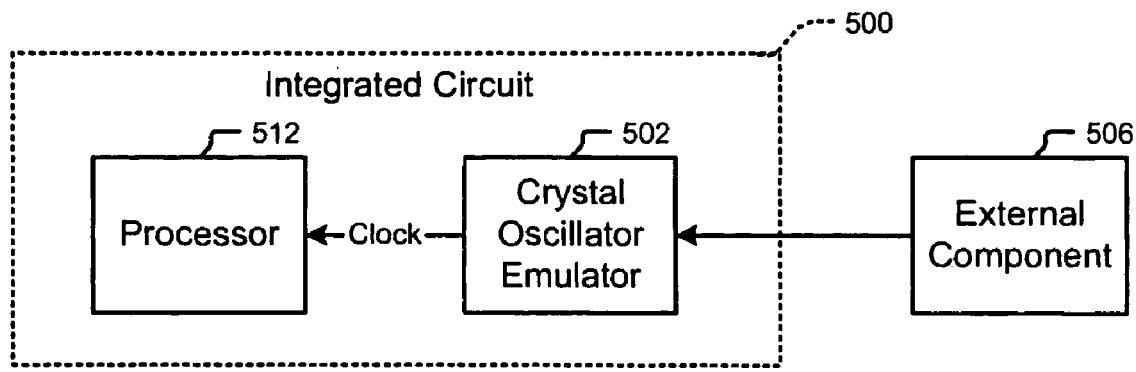
FIG. 15 is a functional block diagram of an integrated circuit including a processor and a crystal oscillator emulator that generates a clock signal for the processor and that employs an external component for setting clock speed.

Referring now to FIGS. 13–15, an integrated circuit 500 includes a crystal oscillator emulator 502 that generates a clock signal. One or more circuits 504 in the integrated circuit 500 receive the clock signals. The crystal oscillator emulator 502 can be implemented as described above in conjunction with FIGS. 1–12. The circuits 502 can include a processor 512 as shown in FIG. 14 or other circuits. An external component 506 can optionally be used to select the clock frequency of the crystal oscillator emulator 502 as shown in FIGS. 13 and 15.

Figure 16:
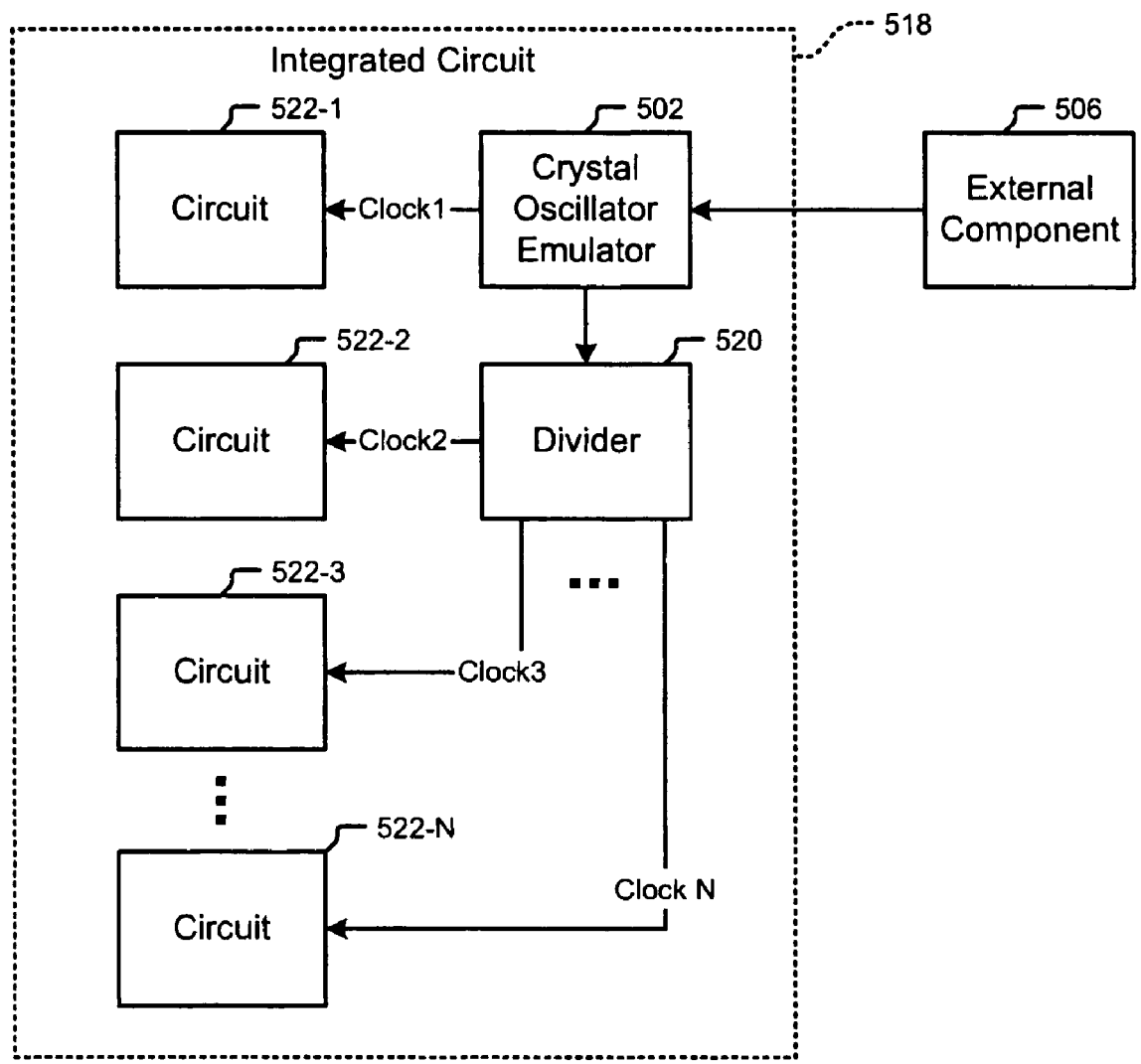
FIG. 16 is a functional block of an integrated circuit including one or more circuits, a crystal oscillator emulator and a clock divider that generates clock signals at one or more other clock frequencies.
Figure 17:
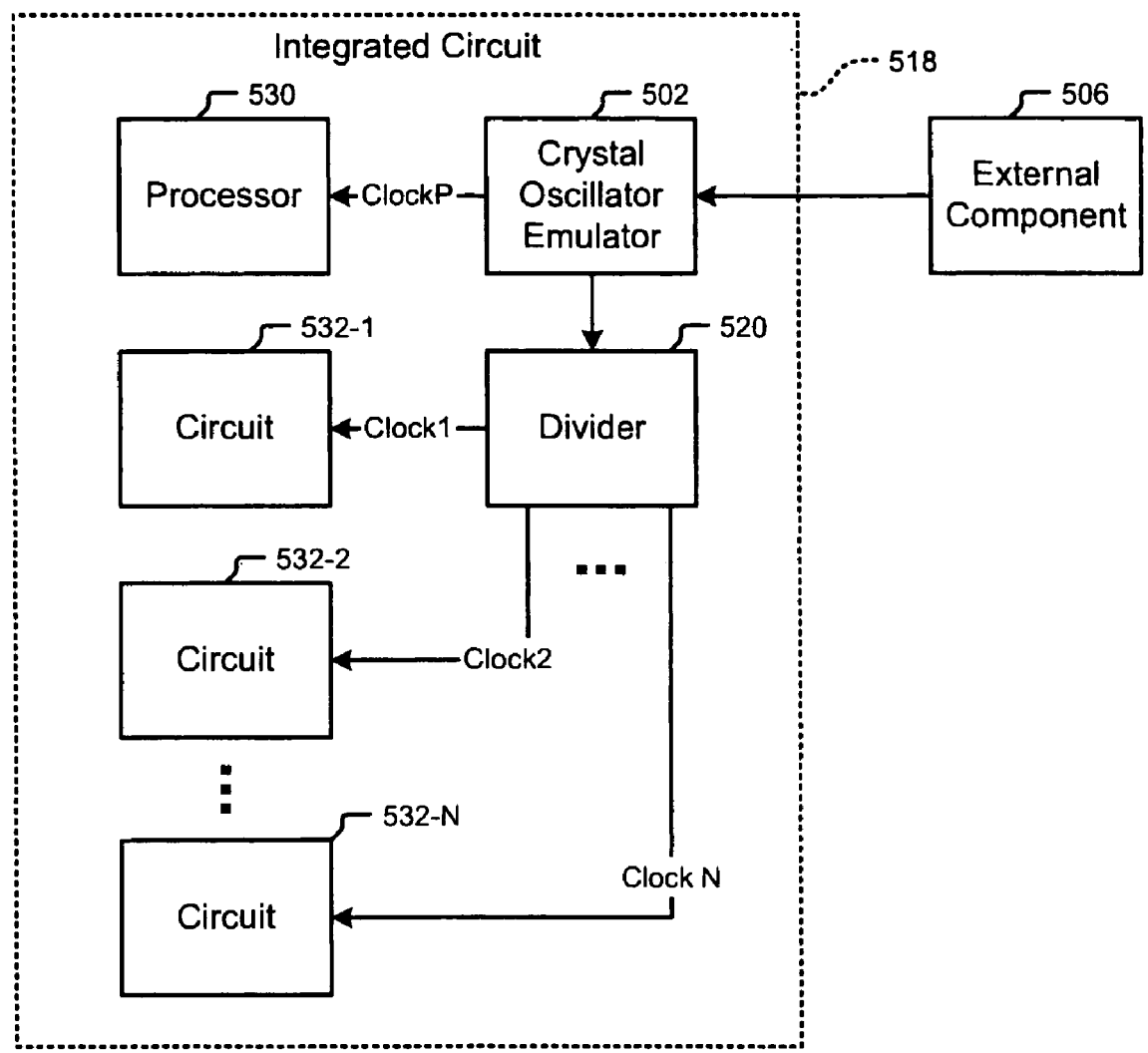
FIG. 17 is a functional block of an integrated circuit including a processor, one or more circuits, a crystal oscillator emulator and a clock divider that generates clock signals at other clock frequencies.
Figure 18:
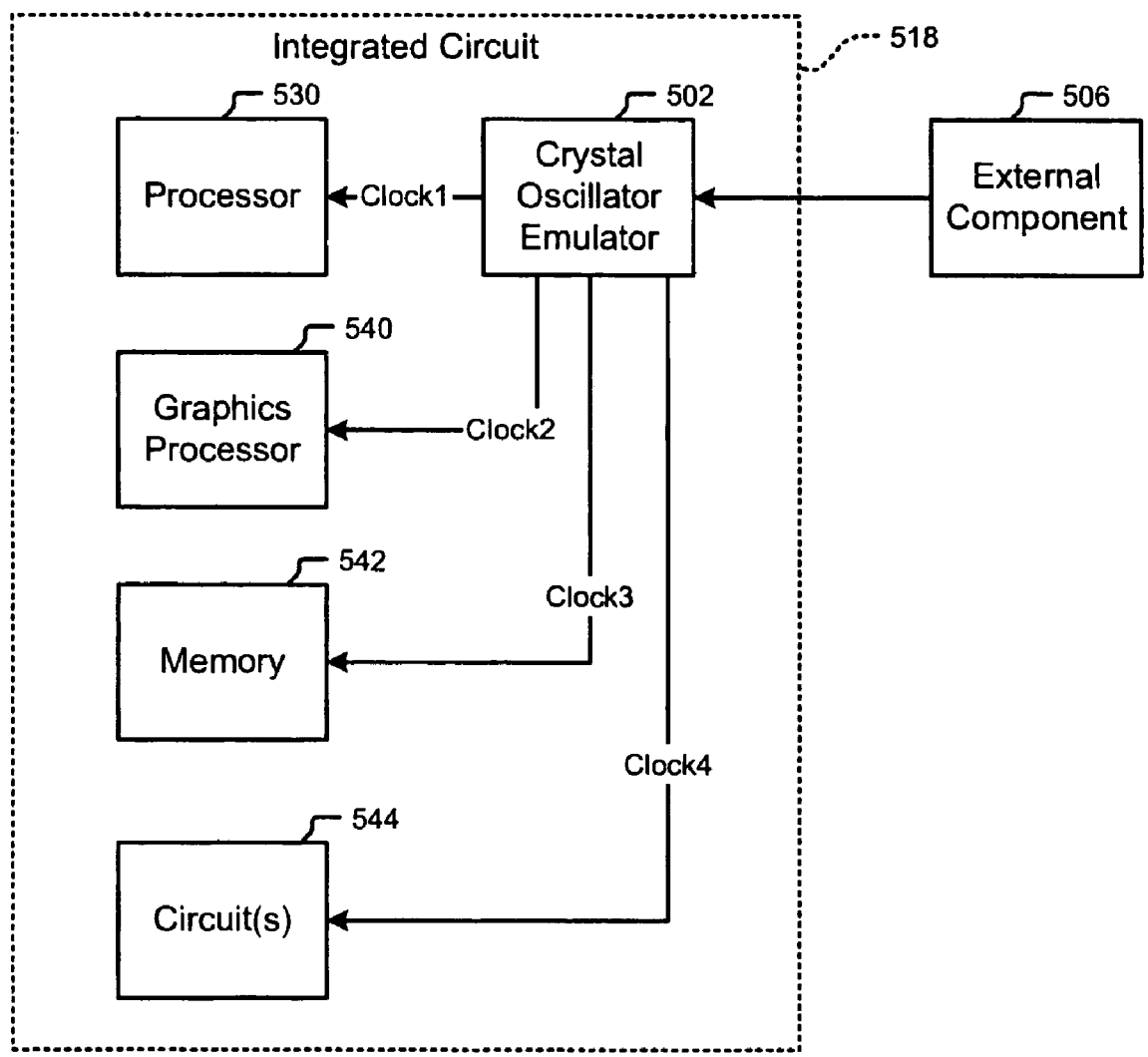
FIG. 18 is a functional block of an integrated circuit including a processor, a graphic processor, one or more circuits, memory and a crystal oscillator emulator that generates clock signals.

Referring now to FIGS. 16–18, an integrated circuit 518 includes a clock divider 520 that generates clock signals at other one or more other clock frequencies for circuits 522-1, 522-2, . . . , and 522-N (collectively circuits 522). The circuits 522 may be interconnected to each other in any manner. The clock divider 520 divides the clock by an integer such as X and/or multiplies the clock signal by Y for 1/X, Y and/or Y/X adjustments. The clock divider 520 may also use one or more additional ratios and/or divisors for producing different clock signals for other circuits 522. The clock divider 520 outputs N-1 clock signals as shown to N-1 circuits 522 in the integrated circuit 518.

In FIG. 17, one of the circuits includes a processor 530. The processor 530 can be connected to the clock divider 520 instead of and/or in addition to the crystal oscillator emulator 502. Additional circuits 532-1, 532-1, and 532-N communicate with the clock divider 520.

In FIG. 18, the crystal oscillator emulator 502 provides clock signals for a processor 530, a graphics processor 540, memory 542 and/or one or more circuits 544 in the integrated circuit 518. A clock divider (not shown) may also be provided. The processor 530, graphics processor 540, memory 542 and/or other circuits 544 may be interconnected in any suitable manner.

Figure 19:
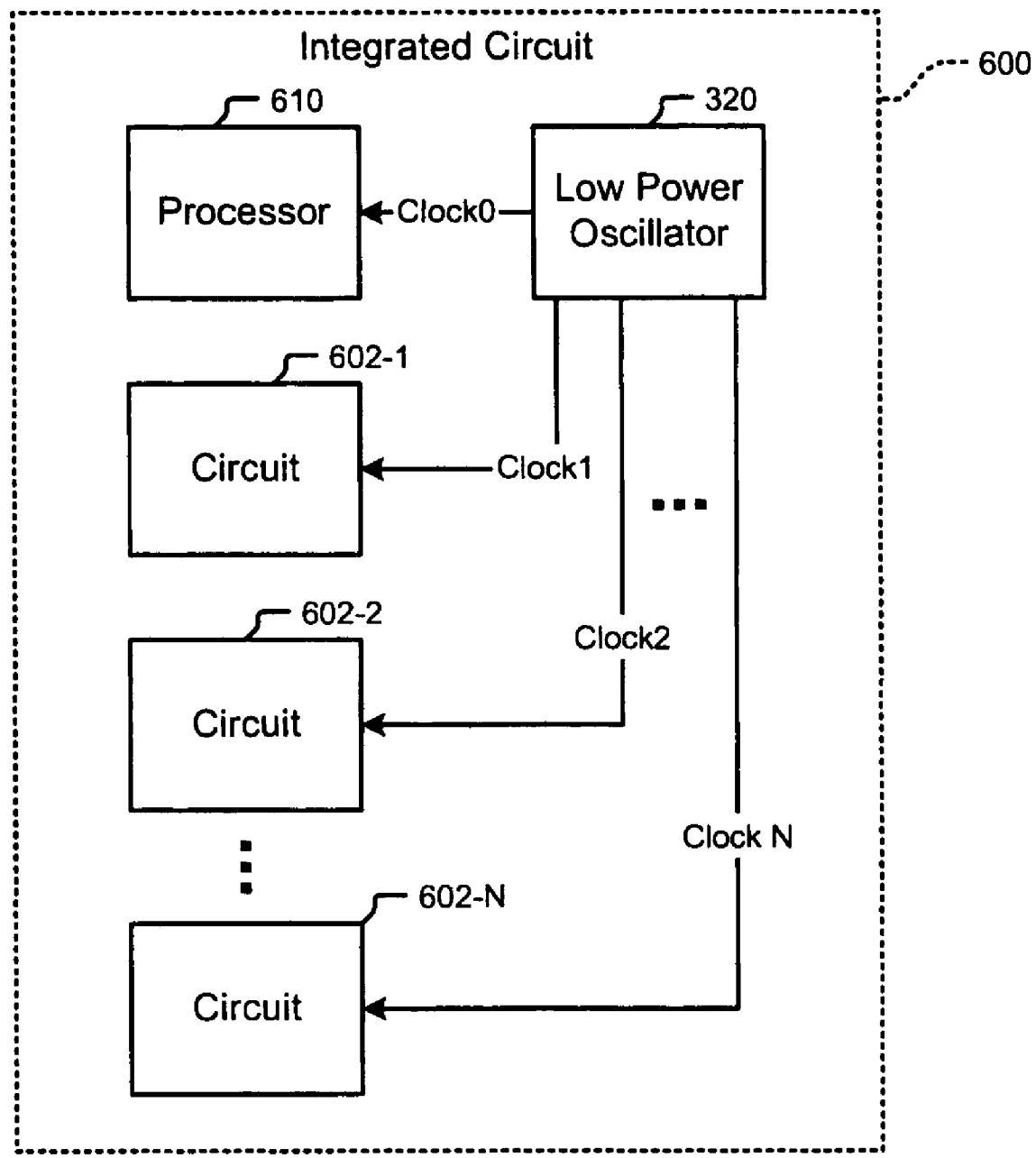
FIG. 19 is a functional block diagram of an integrated circuit including a processor and the low power oscillator of FIG. 11.

Referring now to FIG. 19, an integrated circuit 600 includes one or more circuits 602-1, 602-2, . . . , and 602-N (collectively circuits 602) and the low power oscillator 320, which operates as described above in conjunction with FIG. 11. One of the circuits may include a processor as shown at 610. A clock divider (not shown) may also be provided as described above.

A number of embodiments of the invention have been described. Nevertheless, it will be understood that various modifications may be made without departing from the spirit and scope of the invention. Accordingly, other embodiments are within the scope of the following claims.

What is claimed is:

1. An integrated circuit, comprising:
   a first circuit that receives a clock signal;
   a first temperature sensor that senses a first temperature;
   non-volatile memory that communicates with the first temperature sensor and that outputs calibration data as a function of the first temperature;
   a semiconductor oscillator that communicates with the non-volatile memory and the first circuit and that generates the clock signal having a frequency that is related to the calibration data; and
   a select input that selects the frequency of the output signal as a function of an external passive component.

2. The integrated circuit of claim 1 wherein the first circuit includes a processor that processes data.

3. The integrated circuit of claim 1 wherein the first temperature represents a change in temperature from an initial temperature to a second temperature.

4. The integrated circuit of claim 1 wherein the integrated circuit has a die temperature and wherein the first temperature is approximately equal to the die temperature.

5. An integrated circuit, comprising:
   a first circuit that receives a clock signal;
   a first temperature sensor that senses a first temperature;
   non-volatile memory that communicates with the first temperature sensor and that outputs calibration data as a function of the first temperature;
   a semiconductor oscillator that communicates with the non-volatile memory and the first circuit and that generates the clock signal having a frequency that is related to the calibration data;
   a second temperature sensor that senses an external temperature;
   a heater that controls a die temperature; and
   a controller that controls the heater in response to the first and second temperature sensors.

6. An integrated circuit, comprising:
   a first circuit that receives a clock signal;
   a first temperature sensor that senses a first temperature;
   non-volatile memory that communicates with the first temperature sensor and that outputs calibration data as a function of the first temperature;
   a semiconductor oscillator that communicates with the non-volatile memory and the first circuit and that generates the clock signal having a first frequency that is related to the calibration data;
   a clock divider that generates at least one other clock signal having a lower frequency than the first frequency; and
   at least one other circuit that receives the at least one other clock signal.

7. The integrated circuit of claim 6 further comprising;
   an active silicon oscillator that generates an output signal having a frequency;
   a summer that determines a frequency error between the output signal of the semiconductor oscillator and the output signal of the active silicon oscillator; and a controller that controls the output signal of the active silicon oscillator as a function of the frequency error.

8. The integrated circuit of claim 7 wherein the active silicon oscillator includes a ring oscillator having a supply voltage, and further comprising a regulator that communicates with the controller and that controls the supply voltage to reduce the frequency error.

9. The integrated circuit of claim 7 wherein the controller further controls the output signal of the active semiconductor oscillator as a function of the first temperature.

10. The integrated circuit of claim 8 wherein the regulator controls an electrical characteristic of the supply voltage selected from the group consisting of voltage and current.

11. An integrated circuit, comprising:
a first circuit that receives a clock signal;
a first temperature sensor that senses a first temperature;
non-volatile memory that communicates with the first temperature sensor and that outputs calibration data as a function of the first temperature;
a semiconductor oscillator that communicates with the non-volatile memory and the first circuit and that generates the clock signal having a frequency that is related to the calibration data,
wherein the first circuit includes a processor that processes data; and
a second processor that receives the clock signal.

12. The integrated circuit of claim 6 wherein the at least one other circuit includes a second processor.

13. An integrated circuit, comprising:
a first circuit that receives a clock signal;
a first temperature sensor that senses a die temperature of the integrated circuit and that generates a temperature signal;
a heater that maintains the die temperature at a predetermined operating temperature in response to the temperature signal;
non-volatile memory that stores calibration data relating the predetermined operating temperature to the clock signal;
a semiconductor oscillator that generates the clock signal based on the calibration information; and
a selector that selects the output frequency as a function of an external component.

14. The integrated circuit of claim 13 wherein the first circuit includes a processor.

15. The integrated circuit of claim 13 wherein the first temperature represents a change in temperature from an initial temperature to a second temperature.

16. The integrated circuit of claim 13 wherein the heater is selected from a group consisting of transistor heaters and resistive heaters.

17. An integrated circuit, comprising:
a first circuit that receives a clock signal;
a first temperature sensor that senses a die temperature of the integrated circuit and that generates a temperature signal;
a heater that maintains the die temperature at a predetermined operating temperature in response to the temperature signal;
non-volatile memory that stores calibration data relating the predetermined operating temperature to the clock signal;
a semiconductor oscillator that generates the clock signal based on the calibration information;
a clock divider that generates at least one other clock signal having a lower frequency than the first frequency; and
at least one other circuit that receives the at least one other clock signal.

18. An integrated circuit, comprising:
a first circuit that receives a clock signal;
a first temperature sensor that senses a die temperature of the integrated circuit and that generates a temperature signal;
a heater that maintains the die temperature at a predetermined operating temperature in response to the temperature signal;
non-volatile memory that stores calibration data relating the predetermined operating temperature to the clock signal; and
a semiconductor oscillator that generates the clock signal based on the calibration information,
wherein the first circuit includes a processor;
a second processor that receives the clock signal.

19. The integrated circuit of claim 17 wherein the at least one other circuit includes a second processor.

20. An integrated circuit, comprising:
first circuit means for receiving a clock signal;
first temperature sensing means for sensing a first temperature;
non-volatile storing means that communicates with the first temperature sensing means for outputting calibration data as a function of the first temperature;
semiconductor oscillating means that communicates with the non-volatile storing means and the processing means for generating the clock signal having a frequency that is related to the calibration data; and
selecting means for selecting the frequency of the output signal as a function of an external passive component.

21. The integrated circuit of claim 20 wherein the first circuit means includes processing means for processing data.

22. The integrated circuit of claim 20 wherein the first temperature represents a change in temperature from an initial temperature to a second temperature.

23. The integrated circuit of claim 20 wherein the integrated circuit has a die temperature and wherein the first temperature is approximately equal to the die temperature.

24. An integrated circuit, comprising:
first circuit means for receiving a clock signal;
first temperature sensing means for sensing a first temperature;
non-volatile storing means that communicates with the first temperature sensing means for outputting calibration data as a function of the first temperature;
semiconductor oscillating means that communicates with the non-volatile storing means and a processing means for generating the clock signal having a frequency that is related to the calibration data;
second temperature sensing means for sensing an external temperature;
heating means for controlling a die temperature; and
controlling means for controlling the heating means in response to the first and second temperature sensing means.

25. An integrated circuit, comprising:
first circuit means for receiving a clock signal;
first temperature sensing means for sensing a first temperature;
non-volatile storing means that communicates with the first temperature sensing means for outputting calibration data as a function of the first temperature;
semiconductor oscillating means that communicates with the non-volatile storing means and the processing means for generating the clock signal having a frequency that is related to the calibration data;
clock dividing means for generating at least one other clock signal having a lower frequency than the first frequency; and
at least one other circuit that receives the at least one other clock signal.

26. The integrated circuit of claim 25 further comprising;
active silicon oscillating means for generating an output signal having a frequency;
summing means for determining a frequency error between the output signal of the semiconductor oscillating means and the output signal of the active silicon oscillating means; and
controlling means for controlling the output signal of the active silicon oscillating means as a function of the frequency error.

27. The integrated circuit of claim 26 wherein the active silicon oscillating means includes ring oscillating means for receiving a supply voltage, and further comprising regulating means that communicates with the controlling means for controlling the supply voltage to reduce the frequency error.

28. The integrated circuit of claim 26 wherein the controlling means further controls the output signal of the active semiconductor oscillating means as a function of the first temperature.

29. The integrated circuit of claim 27 wherein the regulating means controls an electrical characteristic of the supply voltage selected from the group consisting of voltage and current.

30. An integrated circuit, comprising:
first circuit means for receiving a clock signal;
first temperature sensing means for sensing a first temperature;
non-volatile storing means that communicates with the first temperature sensing means for outputting calibration data as a function of the first temperature;
semiconductor oscillating means that communicates with the non-volatile storing means and the processing means for generating the clock signal having a frequency that is related to the calibration data,
wherein the first circuit means includes processing means for processing data; and
second processing means that receives the clock signal for processing data.

31. The integrated circuit of claim 25 wherein the at least one other circuit includes second processing means for processing data.

32. An integrated circuit, comprising:
first circuit means for receiving a clock signal;
first temperature sensing means for sensing a die temperature of the integrated circuit and for generating a temperature signal;
heating means for maintaining the die temperature at a predetermined operating temperature in response to the temperature signal;
non-volatile storing means for storing calibration data relating the predetermined operating temperature to the clock signal;
semiconductor oscillating means for generating the clock signal based on the calibration information; and
selecting means for selecting the output frequency as a function of an external component.

33. The integrated circuit of claim 32 wherein the first circuit means includes processing means for processing data.

34. The integrated circuit of claim 32 wherein the first temperature represents a change in temperature from an initial temperature to a second temperature.

35. The integrated circuit of claim 32 wherein the heating means is selected from a group consisting of transistor heater and resistive heater.

36. An integrated circuit, comprising:
first circuit means for receiving a clock signal;
first temperature sensing means for sensing a die temperature of the integrated circuit and for generating a temperature signal;
heating means for maintaining the die temperature at a predetermined operating temperature in response to the temperature signal;
non-volatile storing means for storing calibration data relating the predetermined operating temperature to the clock signal;
semiconductor oscillating means for generating the clock signal based on the calibration information;
clock dividing means for generating at least one other clock signal having a lower frequency than the first frequency; and
at least one other circuit that receives the at least one other clock signal.

37. An integrated circuit, comprising:
first circuit means for receiving a clock signal;
first temperature sensing means for sensing a die temperature of the integrated circuit and for generating a temperature signal;
heating means for maintaining the die temperature at a predetermined operating temperature in response to the temperature signal;
non-volatile storing means for storing calibration data relating the predetermined operating temperature to the clock signal;
semiconductor oscillating means for generating the clock signal based on the calibration information,
wherein the first circuit means includes processing means for processing data; and
second processing means for processing data and that receives the clock signal.

38. The integrated circuit of claim 36 wherein the at least one other circuit includes second processing means for processing data.

39. A method of fabricating an integrated circuit on a semiconductor die, comprising:
fabricating a first circuit on the semiconductor die;
sensing a first temperature of the integrated circuit;
generating calibration data based on the first temperature;
outputting a first clock signal to the first circuit having a frequency that is related to the calibration data; and
selecting the frequency of the output signal as a function of an external passive component.

40. The method of claim 39 wherein the first circuit includes a processor that processes data.

41. The method of claim 39 wherein the first temperature represents a change in temperature from an initial temperature to a second temperature.

42. The method of claim 39 wherein the integrated circuit has a die temperature and wherein the first temperature is approximately equal to the die temperature.

43. The method of claim 39 further comprising:
sensing a second temperature that is equal to an external temperature; and controlling a die temperature in response to the first and second temperatures.

44. A method of fabricating an integrated circuit on a semiconductor die, comprising:
fabricating a first circuit on the semiconductor die;
sensing a first temperature of the integrated circuit;
generating calibration data based on the first temperature;
outputting a first clock signal to the first circuit having a frequency that is related to the calibration data; and
generating at least one other clock signal having a lower frequency than the first frequency for at least one other circuit.

45. The method of claim 44 further comprising;
generating a second output signal having a frequency;
determining a frequency error between the first output signal and the second output signal; and
controlling the second output signal as a function of the frequency error.

46. The method of claim 45 further comprising using a regulator to control a supply voltage to reduce the frequency error.

47. The method of claim 45 further comprising controlling the second output signal as a function of the first temperature.

48. The method of claim 46 wherein the regulator controls an electrical characteristic of the supply voltage selected from the group consisting of voltage and current.

49. A method of fabricating an integrated circuit on a semiconductor die, comprising:
fabricating a first circuit on the semiconductor die;
sensing a first temperature of the integrated circuit;
generating calibration data based on the first temperature;
outputting a first clock signal to the first circuit having a frequency that is related to the calibration data,
wherein the first circuit includes a processor that processes data; and
providing a second processor that receives the clock signal.

50. The method of claim 44 wherein the at least one other circuit includes a second processor.

* * * * *

UNITED STATES PATENT AND TRADEMARK OFFICE
CERTIFICATE OF CORRECTION

PATENT NO. : 7,148,763 B2 Page 1 of 1
APPLICATION NO. : 10/892709
DATED : December 12, 2006
INVENTOR(S) : Sehat Sutardja It is certified that error appears in the above-identified patent and that said Letters Patent is hereby corrected as shown below:

Column 7, Line 54    Delete "in" after "separated"
Column 8, Line 12    Delete "in" after "separated"
Column 11, Line 57   Second "532-1" should be -- 532-2 --

Signed and Sealed this

First Day of July, 2008

JON W. DUDAS
*Director of the United States Patent and Trademark Office*